US006638786B2

(12) United States Patent
Yamamoto

(10) Patent No.: US 6,638,786 B2
(45) Date of Patent: Oct. 28, 2003

(54) IMAGE SENSOR HAVING LARGE MICRO-LENSES AT THE PERIPHERAL REGIONS

(75) Inventor: Katsumi Yamamoto, Shanghai (CN)

(73) Assignee: Hua Wei Semiconductor (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 10/280,854

(22) Filed: Oct. 25, 2002

(65) Prior Publication Data

US 2003/0042490 A1 Mar. 6, 2003

(51) Int. Cl.[7] ................................................ H01L 21/00
(52) U.S. Cl. ............................ 438/57; 438/65; 438/66; 438/73
(58) Field of Search ..................... 348/272; 359/620; 430/273.1, 5, 7, 321, 322, 323, 324; 438/57, 60, 69, 73, 75, 65, 66, 725, 734

(56) References Cited

U.S. PATENT DOCUMENTS

| | | | | |
|---|---|---|---|---|
| 5,830,605 | A | * | 11/1998 | Umeki et al. |
| 6,083,429 | A | * | 7/2000 | Wester |
| 6,137,634 | A | * | 10/2000 | Li |
| 6,187,485 | B1 | * | 2/2001 | Matsushima et al. |
| 6,261,861 | B1 | | 7/2001 | Pai et al. |
| 6,271,900 | B1 | * | 8/2001 | Li |
| 6,274,917 | B1 | | 8/2001 | Fan et al. |
| 6,297,071 | B1 | | 10/2001 | Wake |
| 6,362,513 | B2 | | 3/2002 | Wester |
| 6,436,851 | B1 | | 8/2002 | Young et al. |
| 6,577,342 | B1 | * | 6/2003 | Wester |
| 6,587,147 | B1 | * | 7/2003 | Li |
| 2002/0140832 | A1 | * | 10/2002 | Summa |
| 2003/0059725 | A1 | * | 3/2003 | Takahashi et al. |
| 2003/0071271 | A1 | * | 4/2003 | Suzuki et al. |

\* cited by examiner

*Primary Examiner*—Savitri Mulpuri
(74) *Attorney, Agent, or Firm*—Perkins Coie LLP

(57) ABSTRACT

An image sensor includes an array of pixels formed in a semiconductor substrate. The pixels are grouped as a center portion of pixels and an outer portion of pixels. A first set of micro-lenses is formed over each of the pixels in the center portion of pixels. A second set of micro-lenses is formed over each of the pixels in the outer portion of pixels. The second set of micro-lenses differ from said first set of micro-lenses. In one embodiment, the second set of micro-lenses are taller than the first set of micro-lenses.

6 Claims, 6 Drawing Sheets

IMAGE SENSOR HAVING LARGE MICRO-LENSES AT THE PERIPHERAL REGIONS

TECHNICAL FIELD

The present invention relates to image sensors, and more particularly, towards an image sensor that has taller micro-lenses in the outer regions of the pixel array.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. Important parts of the image sensor are the color filters and micro-lens structures formed atop of the pixels. The color filters, as the name implies, are operative, in conjunction with signal processing, to provide a color image. The micro-lenses serve to focus the incident light onto the pixels, and thus to improve the fill factor of each pixel.

Conventionally, micro-lenses are formed by spin coating a layer of micro-lens material onto a planarized layer. The micro-lens material is then developed to form cylindrical or other shaped regions that are centered above each pixel. Then, the micro-lens material is heated and reflowed to form a hemispherical micro-lens. FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Moreover, in the region between the light detecting elements 103 and the micro-lens 105, denoted by reference numeral 107, there are various intervening layers that would typically include the color filter layers and various metal conducting lines. These components are excluded from the diagram in order to simplify the explanation herein and not to obscure the invention.

In the prior art, the formation of the micro-lenses is controlled such that the shape of the micro-lenses exhibits uniformity throughout all of the pixels of the image sensor. However, the applicant has observed a variation in the amount of light captured by the pixels, with the pixels near the center of the image sensor collecting more light than the pixels in the periphery of the image sensor.

FIG. 3 illustrates one reason why this occurs. In FIG. 3, an image sensor 101 typically works in conjunction with an imaging lens 204 to capture an image. The imaging lens 204 takes incident light and transmits it to the image sensor 101 as shown in FIG. 2. As seen, for those pixels that are located in the center of the image sensor 101, the incident light from the imaging lens 204 is focused correctly to the light detecting elements. However, for those pixels that are located at the outer regions of the image sensor 101, the incident light from the imaging lens 204 is not perpendicular to the micro-lens, thereby causing the focused incident light to be misaligned to the light detecting element. This in turn results in relatively less light being captured by the light detecting element. This is referred to herein as the "dark corner" phenomena.

DETAILED DESCRIPTION

The present invention relates to a micro-lens structure for use with image sensors, either of the CMOS or CCD type. Specifically, micro-lenses covering pixels in the outer regions (periphery) of the image sensor array are made of a different shape (such as taller) than those micro-lens in the center region of the image sensor. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
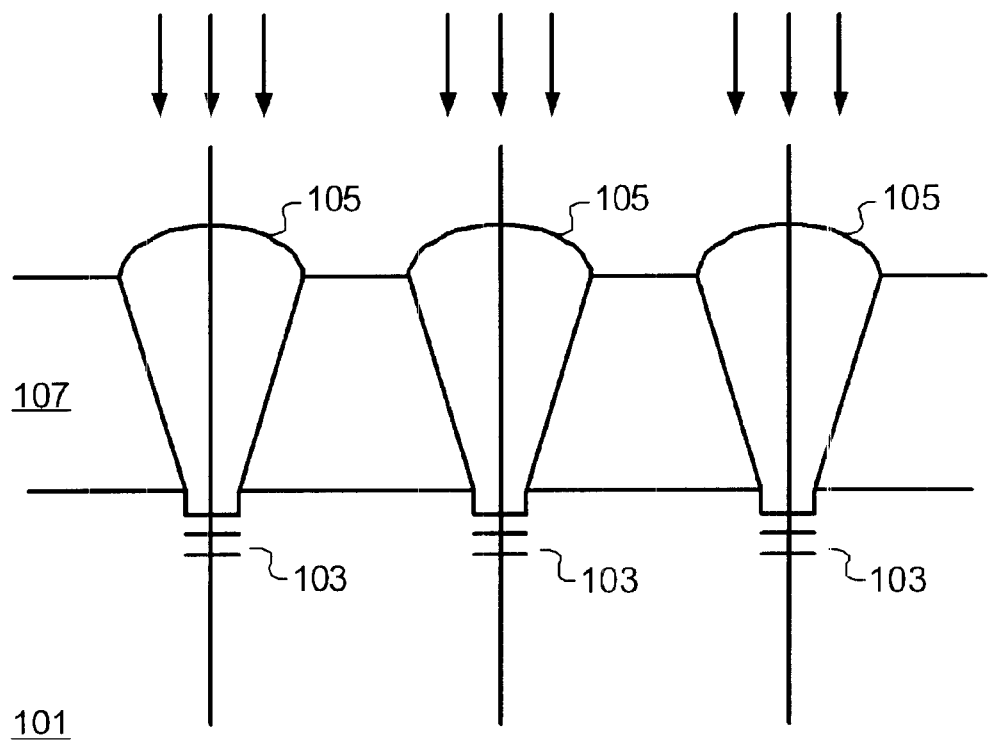
FIG. 1 is a prior art cross sectional view of a portion of an image sensor.
Figure 2:
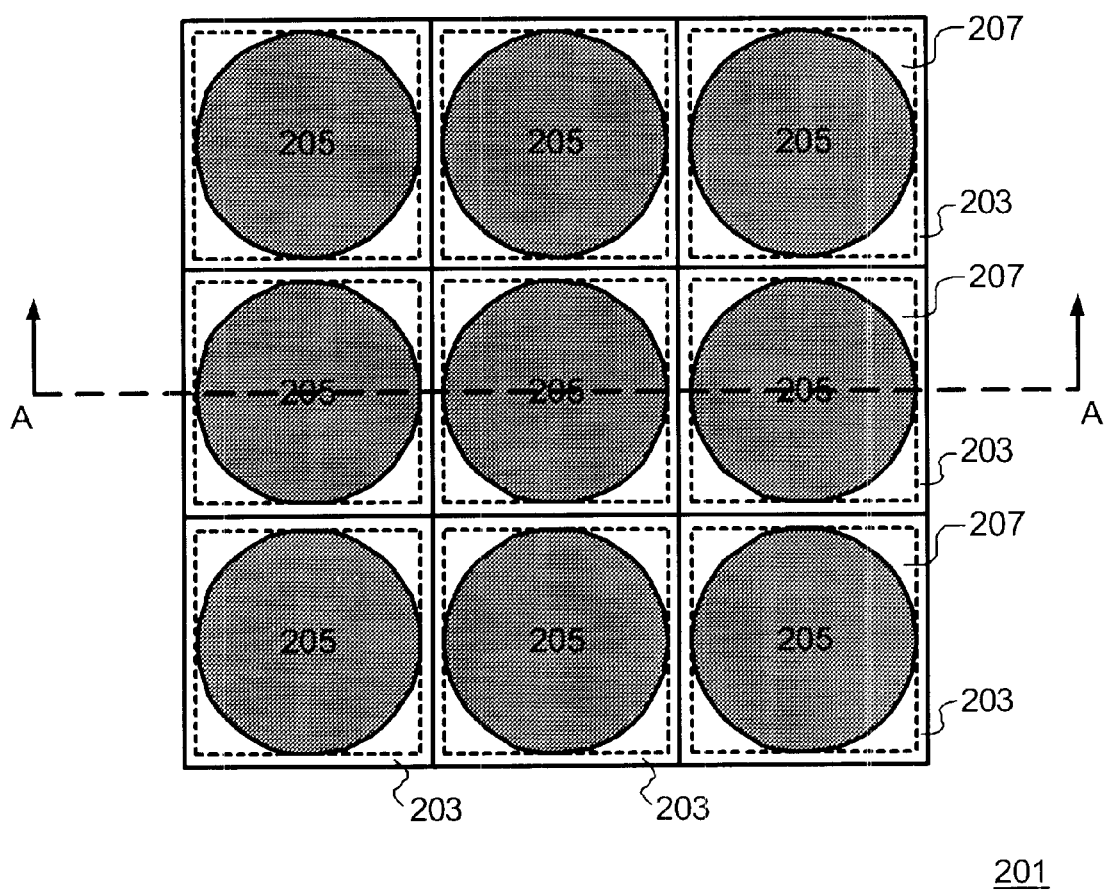
FIG. 2 is a top view of an image sensor showing pixels arranged in a two dimensional array and with micro-lenses formed thereon.
Figure 3:
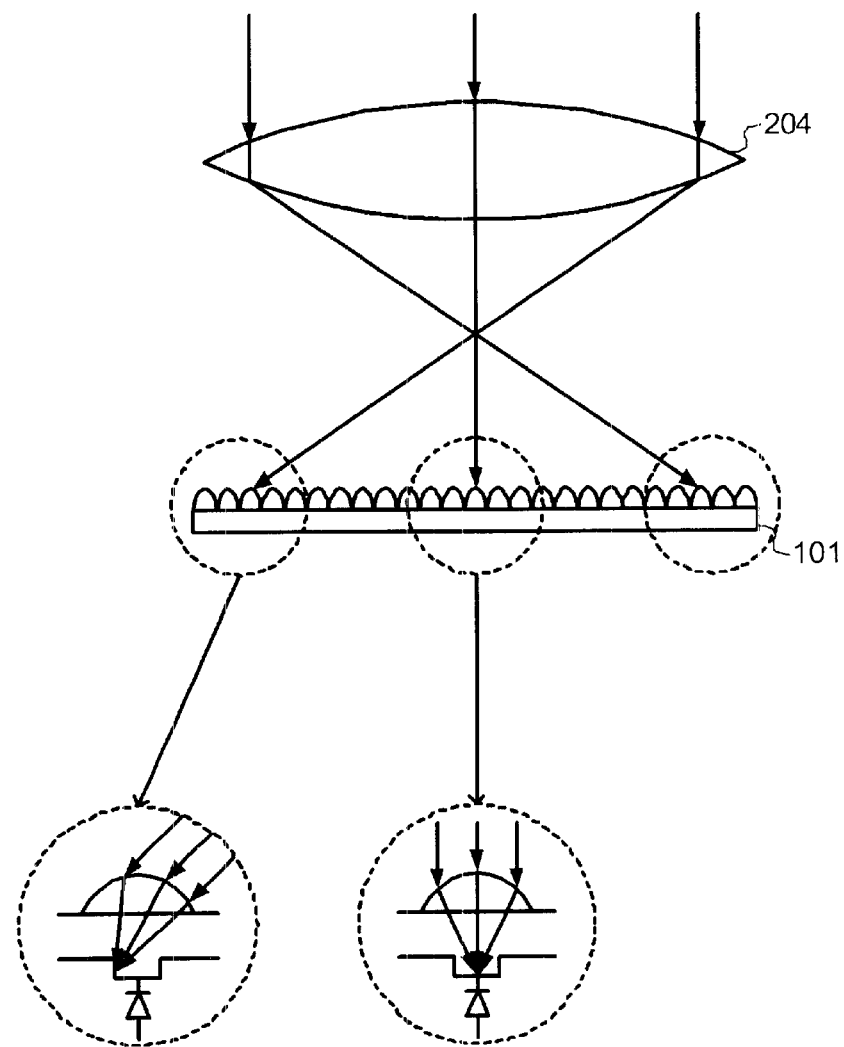
FIG. 3 is a cross sectional view of an image sensor and imaging lens illustrating the "dark corner" phenomena.

FIG. 2 shows a top view of an image sensor 201 formed in accordance with the present invention. The image sensor 201 includes a plurality of pixels 203 typically arranged in a two dimensional array. In the example shown in FIG. 2, the image sensor shows a three by three array of pixels 203, though it can be appreciated that an actual mage sensor 201 would have many more pixels, arranged in perhaps over a thousand rows and/or a thousand columns. Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2. In one embodiment, the pixels 203 may be active pixels, commonly known in the prior art.

Formed atop of each pixel 203 is a micro-lens 205. Additionally, associated with each pixel 203 is a color filter 207. The color filter 207 may be placed either between the micro-lens 205 and the light sensitive element, or alternatively, be formed atop of the micro-lens 205. The color filter 207 is typically a pigmented or dyed material that will only allow a narrow band of light to pass therethrough, for example, red, blue, or green. In other embodiments, the color filter may be cyan, yellow, or magenta. These are but example colors for the color filters 207 and the present invention is meant to encompass a color filter 207 having any color. While the use of pigmented or dyed color materials is the most prevalent form of color filters, other reflective type color filters may be used, such as a multilayer stack reflective material. The formation of color filters 207 is known in art and will not be described herein to avoid any unnecessary obscuration with the description of the present invention. For example, U.S. Pat. Nos. 6,297,071, U.S. Pat. No. 6,362,513, and U.S. Pat. No. 6,271,900 show the current state of the color filter art.

However, contrary to the prior art, the micro-lenses 205 that are in the periphery of the image sensor are of a different shape than the micro-lenses 205 in the center of the image sensor. The different shape of the micro-lenses 205 in the periphery is adapted to compensate for incident light that enters the micro-lens at an angle.

Figure 4:
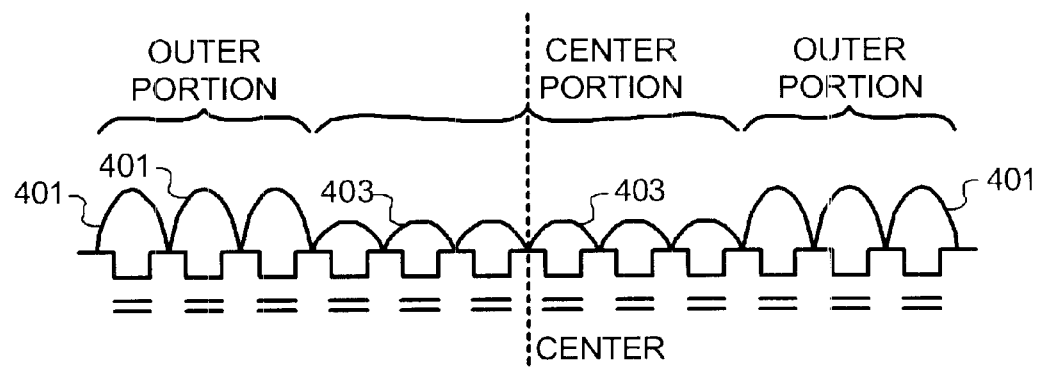
FIG. 4 is a cross sectional view of an image sensor formed according to one embodiment of the present invention.

Turning to FIG. 4, which shows a cross section view of the image sensor 201, in one embodiment, the micro-lenses 401 in the periphery are taller than the micro-lenses 403 in the center region. It has been found that the taller (hence larger) micro-lenses 401 are better suited to capturing light incident at an angle than the micro-lenses 403. Therefore, the use of the taller micro-lenses 401 compensates for the "dark corner" phenomena. The taller micro-lenses 401 are thus used in an outer portion of the image sensor and the regular micro-lenses 403 are used in a center portion of the image sensor.

The relative sizes of the center portion and the outer portion, i.e. the extent to which the taller micro-lenses 401 are utilized, is dependent on various factors, including but not limited to, the size of the image sensor, the characteristics of the imaging lens used with the image sensor, and the size of the micro-lenses. In some image sensors, the taller micro-lenses 401 may only be used in the outer 0–20% of the pixels of each row and column. However, it can be appreciated that the exact dimensions of the center portion and the outer portion is not to be a limit to the claimed invention. The disclosed invention teaches simply the use of different shaped micro-lenses for different portions of the image sensor.

Further, the relative size of the taller micro-lenses 401 to the micro-lenses 403 is variable dependent upon the particular characteristics of the pixels, image sensor, imaging lens, and other factors. In one embodiment, the taller micro-lenses 401 are between 5–100% taller than the micro-lenses 403, though other relative sizes are possible. In one embodiment, the taller micro-lenses 401 are 1–4 microns in height, whereas the micro-lenses 403 are 1–2 microns in height. However, it can be appreciated that the exact size of the micro-lenses may be varied depending upon other parameters.

There are various methods for making micro-lenses having varying height. For example, in one method, all of the micro-lenses are made to be of the taller micro-lens height using conventional means. Then, the micro-lenses in the center portion of the image sensor may be etched back to reduce their height, using masking and etching techniques. While the above illustrates one method of forming these structures, numerous others may be used. Indeed, one particularly efficient method is disclosed below.

Figure 5:
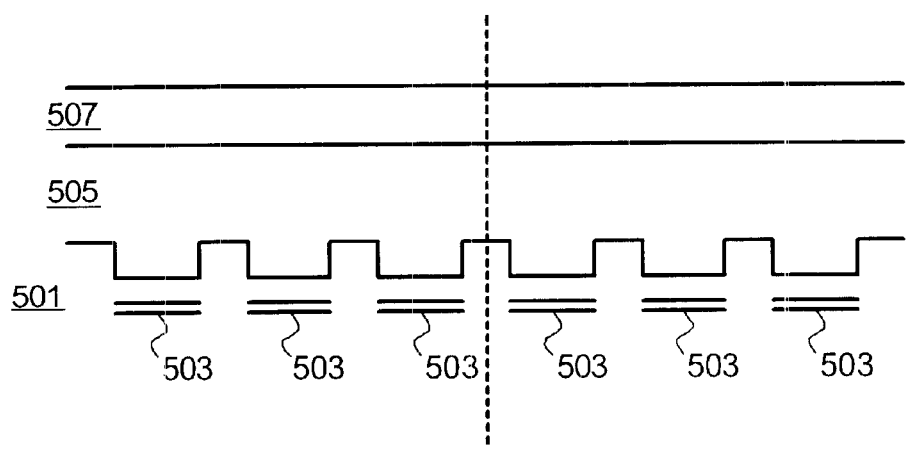
FIGS. 5–9 are cross sectional views of a semiconductor substrate illustrating one method for forming the apparatus of the present invention.

FIG. 5 shows a semiconductor substrate 501 has a plurality of light sensitive elements 503 (associated with the pixels 203 of FIG. 2) formed therein. In this embodiment, the light sensitive element 303 is a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. Nos. 5,904,493 and U.S. Pat. No. 6,320,617.

According to one embodiment, after the pixels 203 are formed in the substrate, intervening layer or layers (collectively identified by reference numeral 505) of an optically transparent (in at least a portion of the visible spectrum) material are formed over the substrate 501. The intervening layers 505 may include color filters, dielectrics, or simply a planarizing dielectric.

Next, a micro-lens material 507 is formed over the intervening layers 505. The micro-lens material 507 may be any material that is optically transparent and subject to formation into a hemispherical shape by processes. For example, some common micro-lens material may be acrylic, such as polymethylmethacrylate (PMMA) or polyglycidylmethacrylate (PGMA). However, it can be appreciated that the precise material used to form the micro-lenses is variable, and may be any currently used or future material.

In one embodiment, the micro-lens material may be a material in liquid state during application such that it can be applied using spin on techniques. This provides the advantage of forming a substantially planar layer. Nevertheless, other blanket deposition methods may also be suitable. In one embodiment, the thickness of the micro-lens material 507 is on the order of 1 to 4 microns. However, thinner or thicker layers of the micro-lens material 507 may also be used, depending on various design parameters.

In one embodiment, the micro-lens layer 507 will need to be patterned. Because of this, it is efficient to use a photoresist type material as the micro-lens material 507. In that way, the micro-lens material 507 can be "directly patterned" by simply the use of a photolithography apparatus and a developing process. In one embodiment, the photolithography is performed by a reduction type stepper apparatus.

Figure 6:
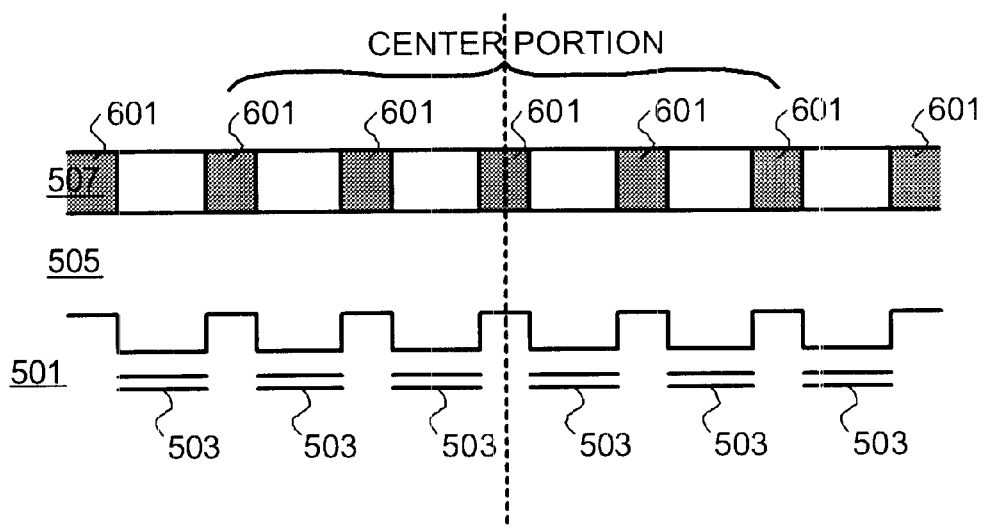

Turning next to FIG. 6, where the micro-lens material 507 is a photoresist, the micro-lens material 507 is exposed using a reticle mask and stepper apparatus. The reticle mask is designed such that gap sections 601 are exposed to the photolithographic radiation (in the case of a positive photoresist). Thus, when developed, gap sections 601 will be removed, leaving blocks of micro-lens material 507, generally over the light detecting elements 503.

Figure 7:
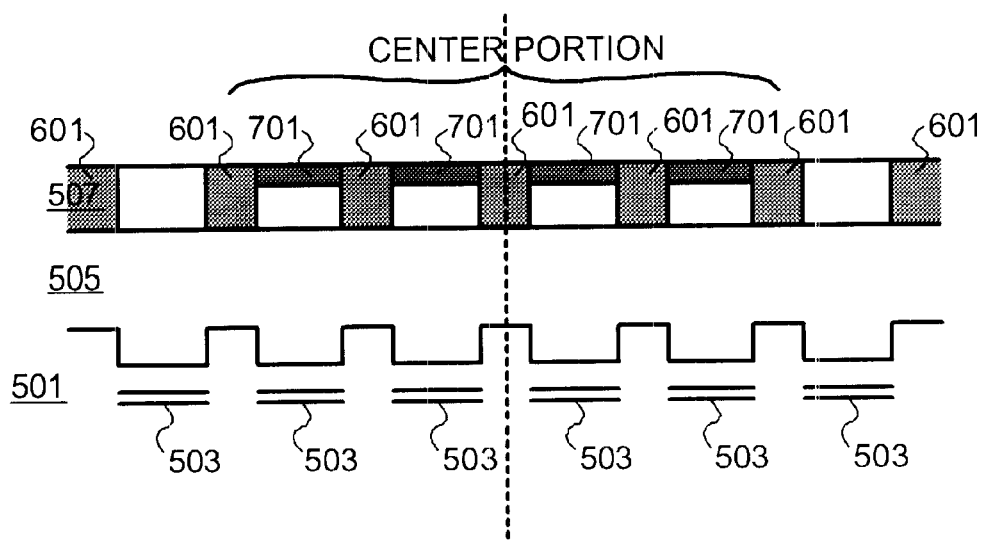

In accordance with the present invention, after exposure using the reticle mask, the micro-lens material 507 is not developed. Instead, a second reticle mask is used by the stepper apparatus to perform a second exposure of the micro-lens material 507. In this second exposure by the second reticle mask, the entire center portion (i.e., the shorter micro-lenses) is exposed. The result is shown in FIG. 7, where top portions 701 of the micro-lens material 507 in the center portion are affected by the photolithographic radiation. It should be noted that the amount of radiation in the second exposure is less than that of the first exposure. Only the top portions 701 need to be exposed sufficiently such that later development will remove the top portions 701. As will be seen in further detail below, the exact amount of radiation in the second exposure is related to how much difference in height is required between the micro-lenses.

Indeed, the specific shape and dimensions of the gap sections 601 and top portions 701 shown in FIGS. 6 and 7 are but one specific embodiment of the present invention. Other specific implementations are possible. For example, the size of the top portions 701 and gap sections 601 shown in FIGS. 6 and 7 may be made smaller or larger depending upon the desired size of the micro-lenses to be formed.

Figure 8:
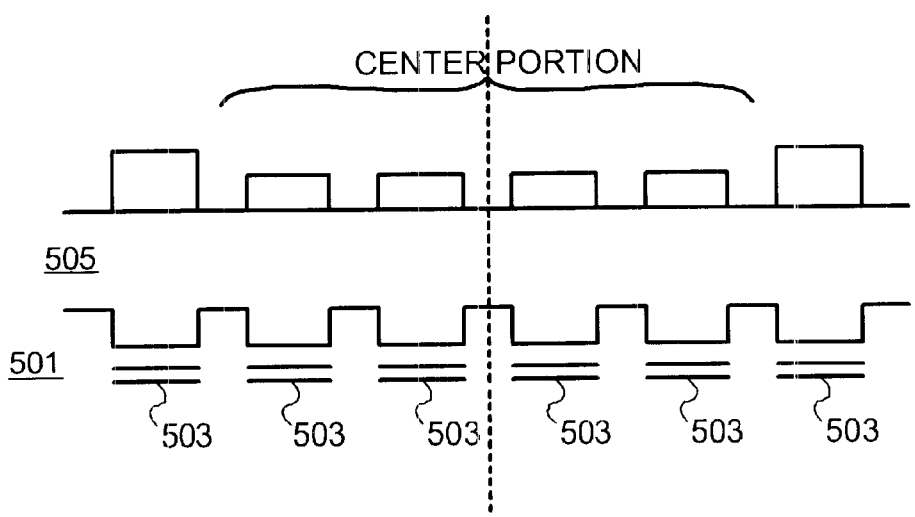
Figure 9:
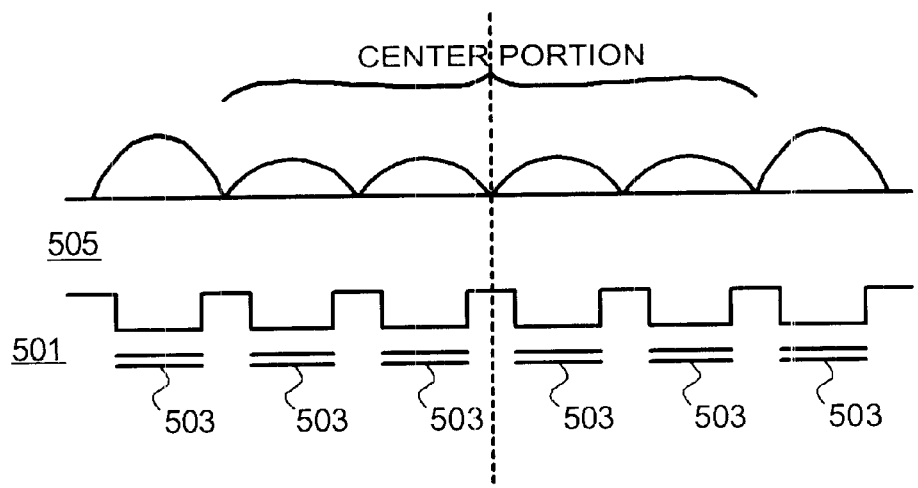

Turning to FIG. 8, once the micro-lens material 507 has been developed (in the case of the micro-lens material 507 being a photoresist), the remaining portions of the micro-lens material 507 are heated to a reflow temperature. This causes the micro-lens material 507 to adopt a minimum surface tension shape, which results in a spherical shape, as shown in FIG. 9.

From the foregoing, it will be appreciated that specific embodiments of the invention have been described herein for purposes of illustration, but that various modifications may be made without deviating from the spirit and scope of the invention. For example, while two distinct sizes of micro-lenses are taught in one embodiment, the present invention can easily be adapted to have multiple sizes of micro-lenses, depending upon the location of the micro-lenses in the image sensor. Accordingly, the invention is not limited except as by the appended claims.

I claim:

1. A method for forming an image sensor comprising:

forming a plurality of pixels in a semiconductor substrate, each pixel including a light sensitive element, said pixels grouped as a center portion of pixels and an outer portion of pixels;

forming a micro-lens material over said plurality of pixels, wherein said micro-lens material is a photoresist;

exposing said micro-lens material with a first reticle mask to generate gap sections in said micro-lens material;

exposing said micro-lens material with a second reticle mask to generate top portions in said micro-lens material located in said center portion of pixels;

developing said micro-lens material to remove said top portions and said gap sections;

reflowing said micro-lens material to form a first set of micro-lenses over each of said pixels in said center portion of pixels and a second set of micro-lenses over each of said pixels in said outer portion of said pixels, wherein said second set of micro-lenses differ from said first set of micro-lenses.

2. The method of claim 1 further including forming a color filter over each pixel, said color filter formed between said micro-lens and said light sensitive element.

3. The method of claim 1 further including forming a color filter over each pixel, said color filter formed over said micro-lens.

4. The method of claim 1 wherein the second set of micro-lenses are taller than said first set of micro-lenses.

5. The method of claim 1 wherein the second set of micro-lenses are larger than said first set of micro-lenses.

6. The method of claim 1 wherein said micro-lens material is either polymethylmethacrylate (PMMA) or polyglycidylmethacrylate (PGMA).

* * * * *